United States Patent
Jeong

(10) Patent No.: US 6,707,723 B2
(45) Date of Patent: Mar. 16, 2004

(54) DATA INPUT CIRCUITS AND METHODS OF INPUTTING DATA FOR A SYNCHRONOUS SEMICONDUCTOR MEMORY DEVICE

(75) Inventor: Woo-Seop Jeong, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/279,611

(22) Filed: Oct. 23, 2002

(65) Prior Publication Data

US 2003/0086303 A1 May 8, 2003

(30) Foreign Application Priority Data

Nov. 6, 2001 (KR) ........................................ 2001-68840

(51) Int. Cl.[7] ................................................ G11C 7/00
(52) U.S. Cl. .................... 365/189.05; 365/193; 365/233
(58) Field of Search ........................ 365/189.05, 189.01, 365/189.07, 193, 230.08, 233

(56) References Cited

U.S. PATENT DOCUMENTS 6,522,598 B2 * 2/2003 Ooishi ........................ 365/233

2003/0112697 A1 * 6/2003 Kashiwazaki ............... 365/233

* cited by examiner

*Primary Examiner*—Richard Elms
*Assistant Examiner*—Nam Nguyen
(74) *Attorney, Agent, or Firm*—Marger Johnson & McCollom, P.C.

(57) ABSTRACT

A data input circuit for a synchronous semiconductor memory device may comprise a detection unit for detecting whether the phase of a data strobe signal may lead or lag that of a clock signal. A delay unit may delay the data strobe signal by a first duration when the phase of the data strobe signal leads that of the clock signal and may delay the data strobe signal by a second duration when the phase of the data strobe signal lags that of the clock signal. A data input unit may synchronize a first input data signal previously fetched by the data strobe signal to the clock signal in response to an output signal of the delay unit. The data input circuit may effectively synchronize an input data signal using an internal delay that may be adjusted when a frequency of the clock signal may exceed a predetermined threshold.

24 Claims, 7 Drawing Sheets

US 6,707,723 B2

DATA INPUT CIRCUITS AND METHODS OF INPUTTING DATA FOR A SYNCHRONOUS SEMICONDUCTOR MEMORY DEVICE

This application claims priority and benefit of Korean Patent Application No. 2001-68840, filed on Nov. 6, 2001, the contents of which are incorporated herein by reference in their entirety.

BACKGROUND

The present invention relates to a synchronous semiconductor memory device, and more particularly, to a data input circuit and method of inputting data to a synchronous semiconductor memory device.

A semiconductor memory device may be used as a main memory in a computer system for input and output of data into and from memory cells of the memory device. The data input/output speed of a semiconductor memory device may be very important in deciding an operating speed of a computer system. As a result, there have been continual efforts to improve the operating speeds of semiconductor memory device.

As a result of these efforts, a synchronous dynamic random access memory (SDRAM) has evolved to include internal circuits that control memory operations in synchronization with a clock signal of, e.g., a computer system. Examples of SDRAM may include a single data rate SDRAM (SDR SDRAM) and a double data rate SDRAM (DDR SDRAM). The SDR SDRAM may input or output one data per cycle of a clock signal responsive to a rising or falling edge of the clock signal. On the other hand, the DDR SDRAM may input or output two data per cycle of a clock signal to a first rising edge and then a falling edge of the clock signal. That is, the bandwidth of the DDR SDRAM may be twice that of the SDR DRAM.

With twice the transfer rate, the DDR SDRAM may be understood to have a window of opportunity for transfer of data to/from the DDR SDRAM that is smaller than that of the SDR SDRAM. To accommodate the smaller windows, a data strobe signal may be used to assist controlled retrieval of data from an input/output data signal. Thus, the DDR SDRAM may include an extra pin to allow input of the data strobe signal.

FIG. 1 is a block diagram of a data input circuit for a conventional synchronous semiconductor memory device. Referring to FIG. 1, data input circuit 100 includes data input buffer 110, data delay circuit 112, data fetch circuit 120, synchronous circuit 140, data strobe buffer 160, first delay circuit 162, a second delay circuit 164, clock input buffer 180, and auto pulse generation circuit 182. An external input data signal DIN, an external data strobe signal DS, and an external clock signal CLK may be applied to inputs of data input buffer 110, data strobe buffer 160, and clock input buffer 180, respectively.

During operation of data input circuit 100, data may be fetched from an internal data signal PDIND responsive to data strobe signal PDSD1. The fetched signal may then be converted into two separate internal parallel data signals DI_F and DI_S. Data may then be fetched from the internal parallel data signals DI_F and DI_S in response to the data strobe signal PDSD2 further delayed and may then be synchronized with an internal clock signal PCLK2 to provide parallel data signals DIN_F and DIN_S.

A phase difference between the external data strobe signal DS and the external clock signal CLK may cause variations of up to a half cycle between the two. A technical standard tDQSS may indicate a timing margin between the external clock signal CLK and the external data strobe signal DS, which may include two different cases: CASE1 and CASE2. In a first case, the technical standard tDQSS may be 0.75 tCK (hereinafter, referred to as tDQSS_MIN) and the phase of the external data strobe signal DS may lead that of the external clock signal CLK by tCK/4. In a second case, the technical standard tDQSS may be 1.25 tCK (hereinafter, referred to as tDQSS_MAX) and the phase of the external data strobe signal DS may lag that of the external clock signal CLK by tCK/4. Here, tCK represents a duration of one period or one cycle of the external clock signal CLK.

FIG. 2 is a timing diagram useful for describing exemplary operations of the data input circuit of FIG. 1 for examples where the cycle of the external clock signal CLK may be relatively large. Referring to FIG. 2, the first case of operation (CASE1) shows operation of data input circuit 100 where the technical phase standard is tDQSS_MIN. The second case of operation (CASE2) shows operation of the data input circuit 100 where the technical standard is tDQSS_MAX. Further referencing FIG. 2, a data set-up time tDS may reference a duration required for set-up of data and a data hold time tDH a duration required for data of an external input data signal DIN to be presented or held at an input relative to a rising edge of the data strobe signal DS. Internal parallel data signals DII_F and DII_S represent internal data signals from which the internal parallel data signals DI_F and DI_S may be fetched by the second internal data strobe signal PDSD2.

In the first case, CASE1 of tDQSS_MIN, the phase of the external data strobe signal DS leads that of the external clock signal CLK by tCK/4. In order to synchronize the external input data signal DIN as fetched by the external data strobe signal DS with the phase of the external clock signal CLK, it may be understood that a seemingly large delay may be required between the edge of the internal data strobe signal PDSD1 and that of the internal data strobe signal PDSD2. This delay time T1 as shown in FIG. 2 should be large enough in order to allow retrieval of valid data from the respective data signal.

In the second case CASE2 of tDQSS_MAX, the phase of the external data strobe signal DS may lag that of the external clock signal CLK by tCK/4. In order to synchronize the external input data signal DIN fetched by the external data strobe signal DS with the external clock signal CLK, a small delay may be needed between edges of the internal data strobe signal PDSD1 and the internal data strobe signal PDSD2 to allow retrieval of valid data from the data signal. This delay time T2 as shown in FIG. 2 might need to be less than that of the first case.

However, the conventional data input circuit 100 may use a fixed delay for the establishment of the second internal data strobe signal PDSD2 relative the first PDSD1. As a result, the operating characteristics for the above-mentioned cases of tDQSS_MIN and tDQSS_MAX may remain fixed and may compromise synchronization at the two different extremes. That is, since the delay duration that is used for establishing the second internal data strobe signal PDSD2 from the first PDSD1 may be fixed, regardless of a cycle length or frequency of the clock signal, the timing margin due to this fixed delay duration may become insufficient when the cycle length of the external clock signal CLK decreases as the operating frequency increases.

FIG. 3 is a timing diagram useful for describing an operation of the conventional data input circuit of FIG. 1 when the cycle of the external clock signal CLK may be relatively small. It may be observed from the exemplary depictions of FIG. 3 that synchronization data failures may result during the short cycle clock operations of the conventional data input circuit 100.

For example, for the case of tDQSS_MIN (CASE1), variations in process, voltage, and/or temperature may cause the duration T1 for the delay associated with generating the second internal data strobe signal PDSD2 from the first PDSD1 to decrease. Under certain conditions, such reductions may interfere with the effective generation of internal parallel data signals DIN0 and DIN1 in the CASE1 conditions.

In another example for the case of tDQSS_MAX (CASE2), variations in process, voltage, and/or temperature may cause the duration T2 associated with the delay for generating of the second internal data strobe signal PDSD2 from the first PDSD1 to increase. Such increases might then cause generation of invalid data under the CASE2 conditions.

SUMMARY OF THE INVENTION

Addressing some of the above problems, embodiments of the present invention may provide a data input circuit and associated methods of operations for a synchronous semiconductor memory device. The embodiments may control a delay duration for generation of a data strobe signal according to a phase relation between the data strobe signal and a clock signal. The controlled duration may allow for effective synchronization of an input data signal fetched by the data strobe signal to the clock signal.

Accordingly to one embodiment of the present invention, a data input circuit for a synchronous semiconductor memory device may comprise a detection unit for detecting whether the phase of a data strobe signal may lead or lag that of a clock signal. A delay unit may delay the data strobe signal by a first duration when the phase of the data strobe signal leads that of the clock signal. Or, the delay unit may delay the data strobe signal by a second duration when the phase of the data strobe signal may lag that of the clock signal. A data input synchronization unit may synchronize an input data signal fetched by the data strobe signal. The fetched signal may be synchronized to the clock signal responsive to the delayed data strobe signal output by the delay unit.

In a further embodiment, the detection unit may determine a phase difference between the data strobe signal and the clock signal of up to one fourth of a cycle of the clock signal. Additionally, the duration established for the first delay may be larger than the duration for the second delay.

According to another embodiment of the present invention, a data input circuit for a synchronous semiconductor memory device may comprise a data buffer to receive an external input data signal and to buffer the received signal for generating a first internal input data signal. A data strobe buffer may receive an external data strobe signal and buffer the received data strobe signal to generate a first internal data strobe signal. A clock buffer may receive and buffer an external clock signal to generate a first internal clock signal and/or second internal clock signal. A data delay circuit may delay the first internal input data signal to generate a second internal input data signal. A first strobe delay circuit may delay the first internal data strobe signal to generate a second internal data strobe signal. A detection circuit may detect whether the phase of the first internal data strobe signal may lead or lag that of the first internal clock signal and may generate a detection signal based on the detection. A data fetch circuit may fetch the second internal input data signal in synchronous relationship with respect to the second internal data strobe signal for generating a first strobe synchronous data signal. A second delay circuit may delay the second internal data strobe signal with a duration established by the detection signal for generating a third internal data strobe signal. A synchronization circuit may synchronize the first stage synchronous data signal to be in synchronous relationship with respect to, firstly, the third internal data strobe signal and, subsequently, the second internal clock signal for generating a second stage synchronous data signal.

In a further embodiment, the detection circuit may comprise a first transmission unit to transmit, responsive to the first internal data strobe signal, the first internal clock signal to a first latch unit. The first latch unit may receive and latch the first internal clock signal transmitted thereto by the first transmission unit. A second transmission unit may be operable to transmit, responsive to the first internal data strobe, the first internal clock signal latched by the first latch unit to a second latch unit. The second latch unit may latch the first internal clock signal that may be transmitted thereto by the second transmission unit. An AND circuit may perform an AND operation of the first internal clock signal latched by the second latch unit with an internal write signal. The write signal may be derived from a write operation of the synchronous semiconductor memory device. The output of the AND circuit may serve as the detection signal provided by the detection circuit to the second delay circuit.

In another embodiment, the second delay circuit may comprise a first NAND gate that may invert and perform an AND operation of an inverted representation of the detection signal with the second internal data strobe signal after it has been propagated through and delayed by an inverter chain. A second NAND gate may invert and perform an AND operation of the detection signal with the second internal data strobe signal that may have similarly been propagated through and delayed by the inverter chain. An OR circuit may be operative to output one of the output signals of the first and second NAND gates in which one of the output signals of the first NAND and second gates may be delayed by a predetermined duration relative the other. The output of this OR circuit may serve as the third internal data strobe signal.

According to another embodiment of the present invention, a method of inputting data to a synchronous semiconductor memory device may comprise detecting whether the phase of a data strobe signal may lead or lag that of a clock signal. The data strobe signal may be delayed by a first duration when the detecting determines that the phase of the data strobe signal may lead that of the clock signal. Alternatively, the data strobe signal may be delayed by a second duration when the detecting determines that the phase of the data strobe signal may lag that of the clock signal. A data signal may be, firstly, fetched in synchronous relationship to the data strobe signal. The fetched data signal may then be synchronized with reference to the delayed strobe signal and, thereafter, to the clock signal.

In one embodiment, the detecting may determine a phase difference between the data strobe signal and the clock signal of up to one-fourth of a cycle of the clock signal and the duration of the first delay may be longer than that of the second delay.

In exemplary embodiments, the data input circuit and its method of operation can effectively synchronize an input data signal with a clock signal, even for clock signals of small cycle or high frequency.

BRIEF DESCRIPTION OF THE DRAWINGS

Embodiments of the present invention may become more apparent by description with reference to the accompanying drawings in which.

DETAILED DESCRIPTION

Figure 1:
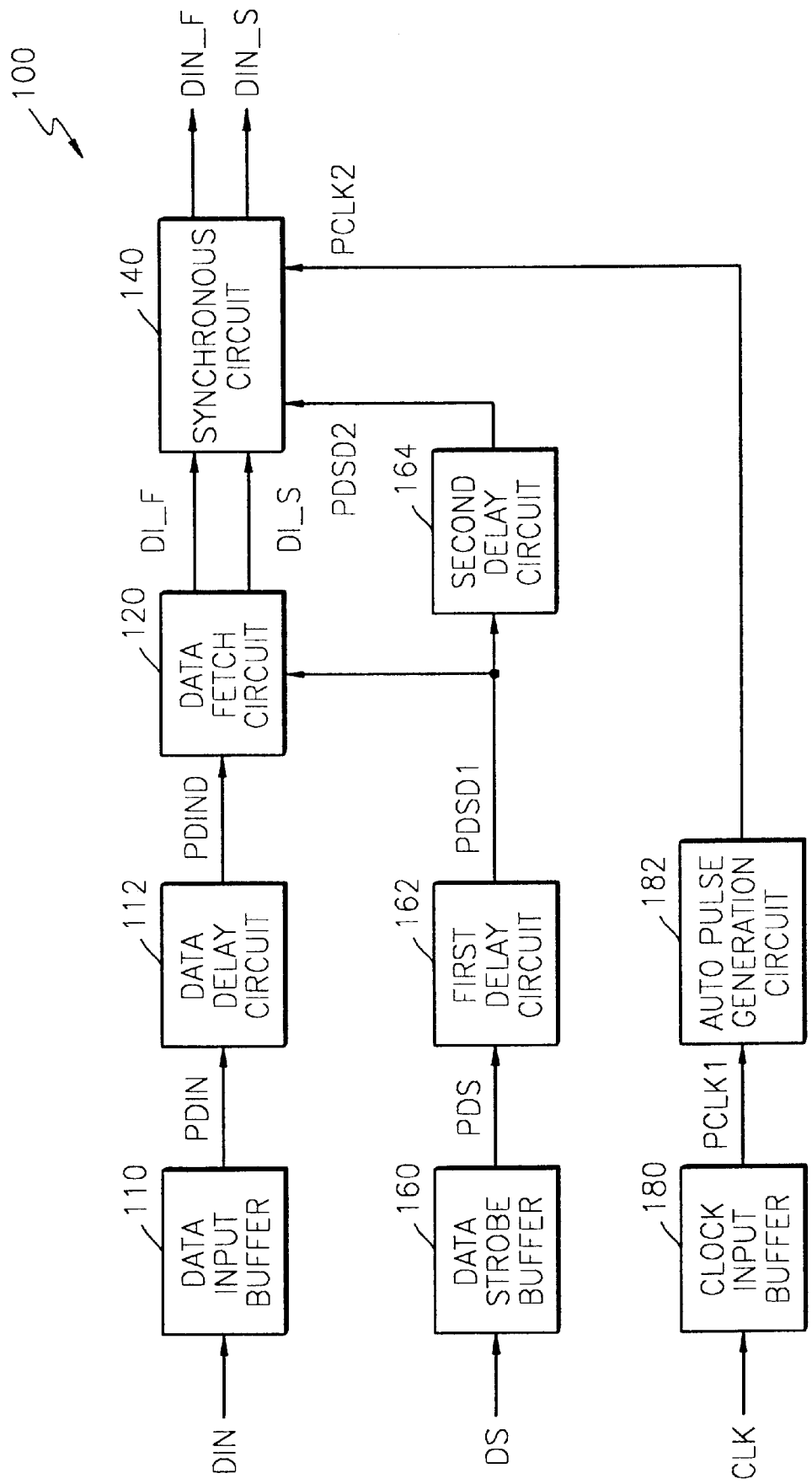
FIG. 1 is a block diagram of a data input circuit for a conventional synchronous semiconductor memory device.
Figure 2:
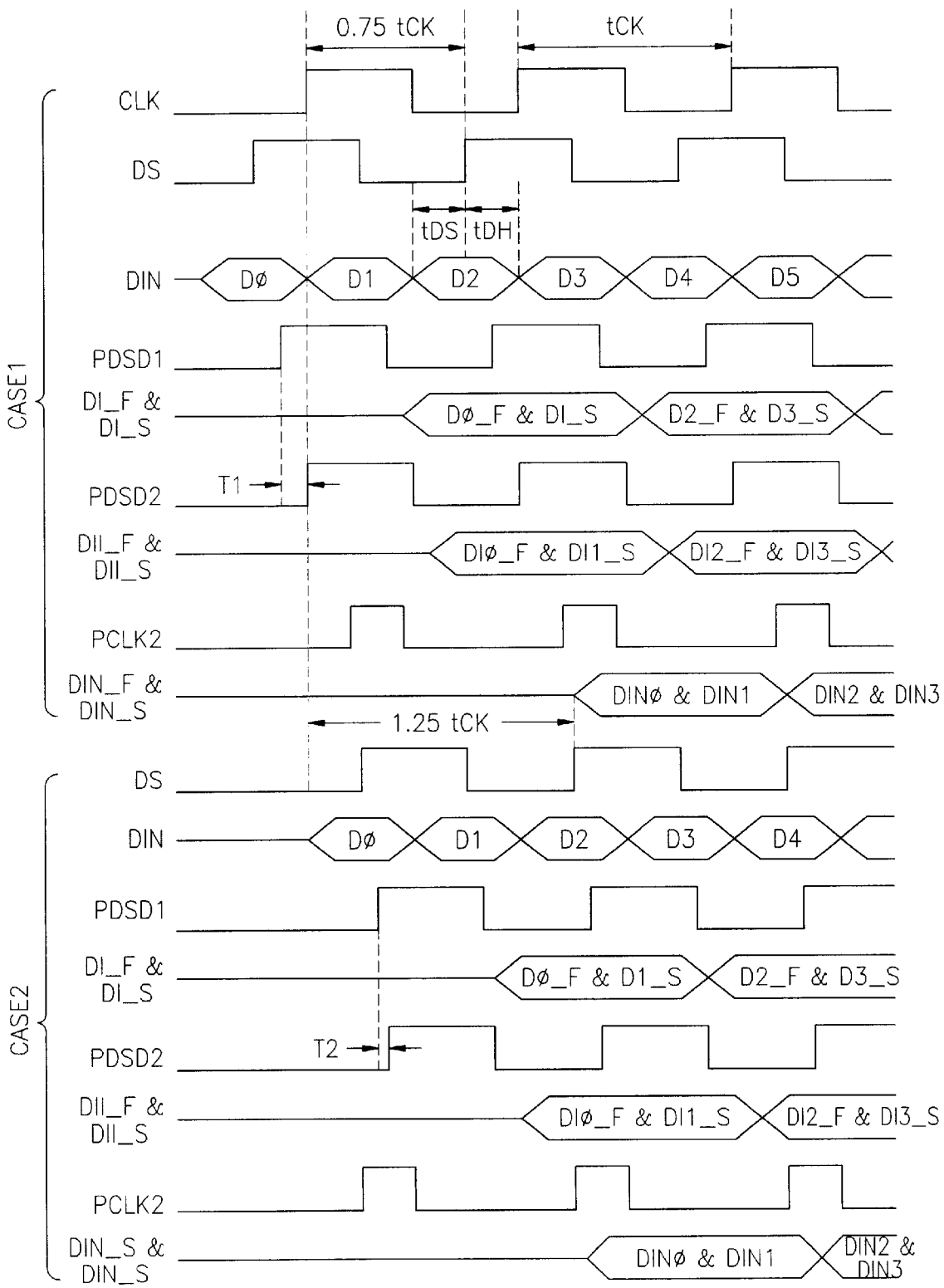
FIG. 2 is a timing diagram useful for describing operation of the data input circuit of FIG. 1 when the cycle of an external clock signal CLK may be relatively large.
Figure 3:
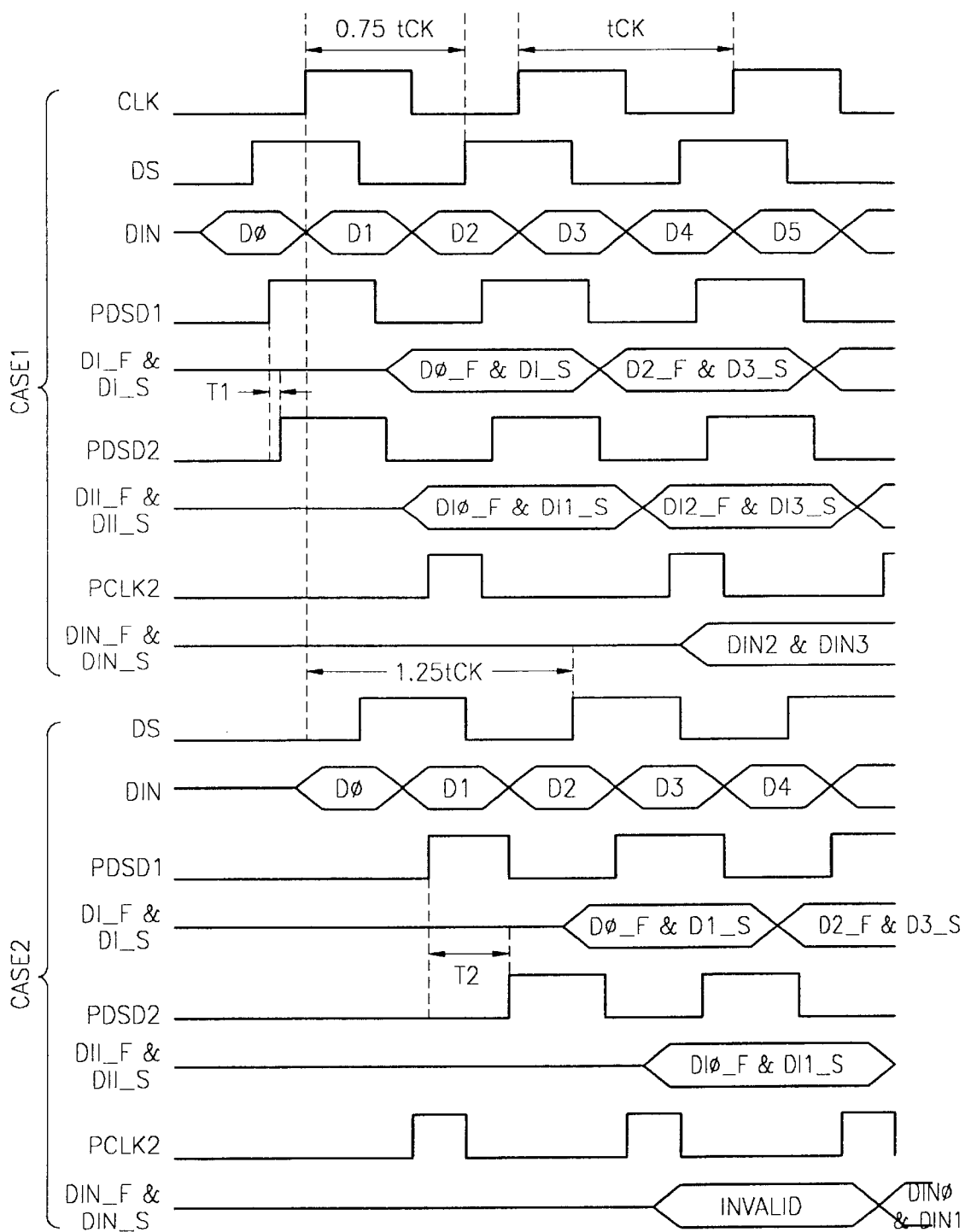
FIG. 3 is a timing diagram useful for describing operation of the data input ciruit of FIG. 1 when the cycle of the external clock signal CLK may be relatively small.

Hereinafter, embodiments of the present invention may be described with reference to the accompanying drawings. In the drawings, like reference numerals may refer to like elements.

As used herein, "fetched" may reference retrieval of data from a data signal. It may also be viewed as sampling of a signal during a given epoch or portion of the data signal.

A data signal may comprise various levels over time. Another signal, such as a strobe or clock, may be used to obtain a value of the data signal at a given moment of the signal. The strobe or clock may comprise a pulse or transition respectively, that may be used to enable extraction of data from the data signal. The extraction may occur at a moment in time that may be substantially coincident with the active pulse or transition. Hereinafter, the extraction of a data valve from a data signal at such moment of time coincident with the pulse or transition of the strobe or clock may be referenced as the fetch. For example, data of a data signal may be fetched responsive to a strobe or clock signal. Additionally, the data of the data signal may be viewed, in certain circumstances, as being retrieved in synchronous relationship to the strobe or clock signal.

In certain embodiments of the present invention, a pass gate may be enabled for a brief duration to allow a signal to pass to a latch circuit. The latch may then latch a value of the signal presented thereto via the enabled pass gate. Thereafter, the pass gate may be disabled and the latch may retain the data value latched therein.

Figure 4:
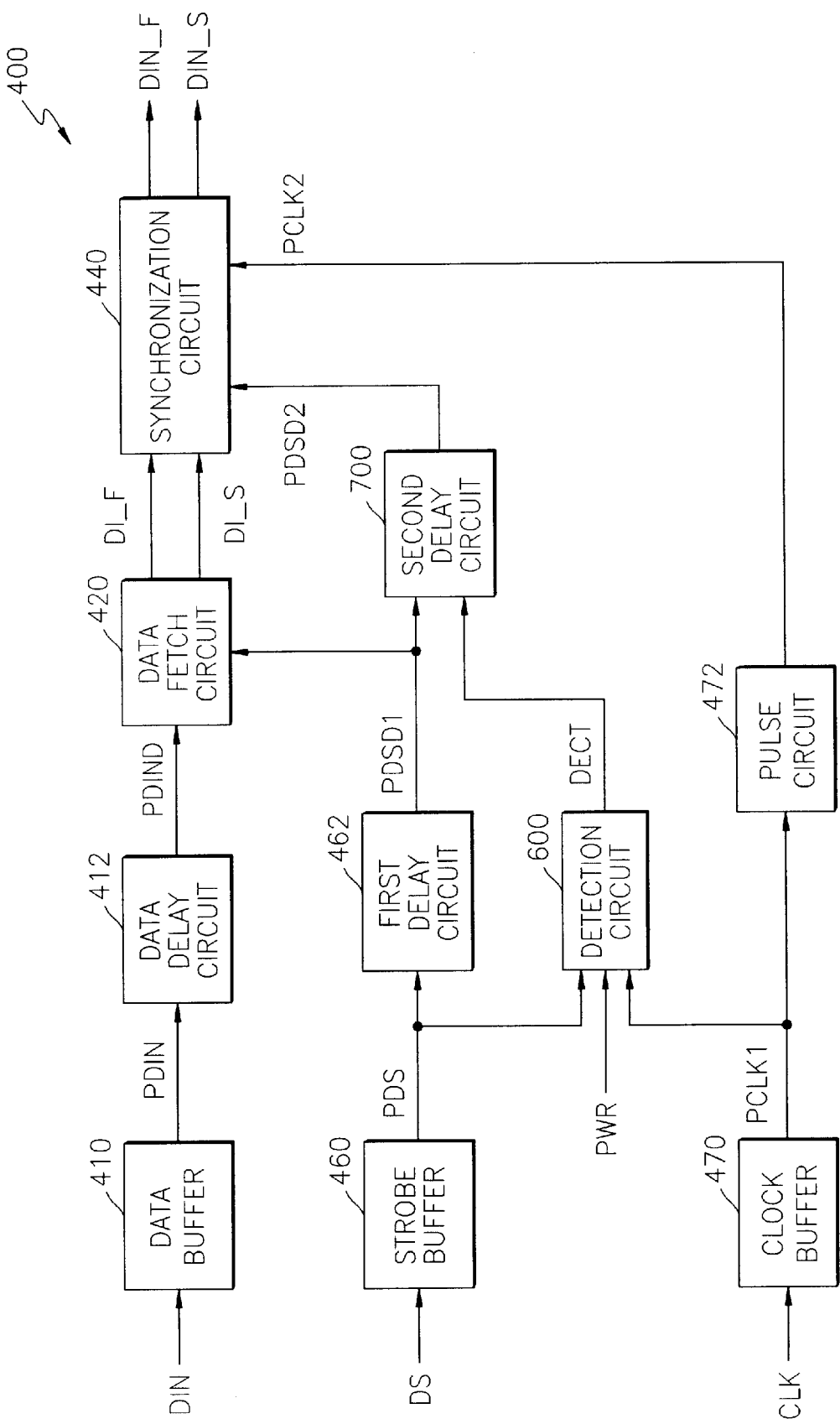
FIG. 4 is a block diagram of a data input circuit for a synchronous semiconductor memory device in accordance with an embodiment of the present invention.

FIG. 4 is a simplified block diagram of a data input circuit for a synchronous semiconductor memory device according to an embodiment of the present invention. Referring to FIG. 4, a data input circuit 400 for a synchronous semiconductor memory device may comprise a data buffer 410, data delay circuit 412, data fetch circuit 420, synchronization circuit 440, strobe buffer 460, first delay circuit 462, detection circuit 600, second delay circuit 700, clock buffer 470, and pulse circuit 472.

The data buffer 410 may receive an external data signal DIN and may buffer the data signal DIN to generate a first internal input data signal PDIN.

The strobe buffer 460 may receive an external strobe signal DS and may buffer strobe signal DS to generate a first internal data strobe signal PDS.

The clock buffer 470 may receive and buffer clock signal CLK to generate a first internal clock signal PCLK1.

The data delay circuit 412 may receive and delay the first internal input data signal to generate a second internal input data signal PDIND. In the path of the strobe signal, first delay circuit 462 may receive and delay the first internal data strobe signal PDS to generate a second internal data strobe signal PDSD1. The data delay circuit 412 and the first delay circuit 462 may be preconfigured to establish an optimal data set-up time tDS and data hold time tDH for the first internal input data signal PDIN relative to the data fetch and synchronization operations that may be described more fully hereinafter.

The data fetch circuit 420 may fetch the second internal input data signal PDIND responsive to and in synchronization with the second internal data strobe signal PDSD1 to generate the first set of the data signals DI_F and DI_S.

The detection circuit 600 may detect a relative phase relationship between the first internal data strobe signal PDS and the first internal clock signal PCLK1 to provide a detection signal DECT based upon the determined phase relationship. The detection circuit may operate responsive to the first internal data strobe signal PDS, the first internal clock signal PCLK1 and an internal write signal PWR. The internal write signal PWR may be generated internal to a synchronous semiconductor memory device during a write operation thereof. In this embodiment, it may be generated with a logic "high" level during such write operation of the synchronous semiconductor memory device.

The second delay circuit 700 may be operative to vary a duration for a delay of the second internal data strobe signal PDSD1. The amount of delay may be set dependent on the level of the detection signal DECT. This further delayed strobe signal may be referenced as a third internal data strobe signal PDSD2.

A pulse circuit 472 may receive the first internal clock signal PCLK1 and be operative to generate a pulse to serve as the second internal clock signal PCLK2. The pulse may be generated automatically in response to a transition of the first internal clock signal PCLK1. The second delay circuit 700 and the pulse circuit 472 may be operable to modify a relative phase relationship between the strobe signal and the clock signal.

Synchronization circuit 440 may fetch the first set of parallel data signals DI_F and DI_S responsive to, firstly, data strobe signal PDSD2. The synchronization circuit may further be responsive to synchronize the fetch data signals the second internal clock signal PCLK2 for generating the second (or resultant) set of parallel data signals DIN_F and DIN_S.

Figure 5:
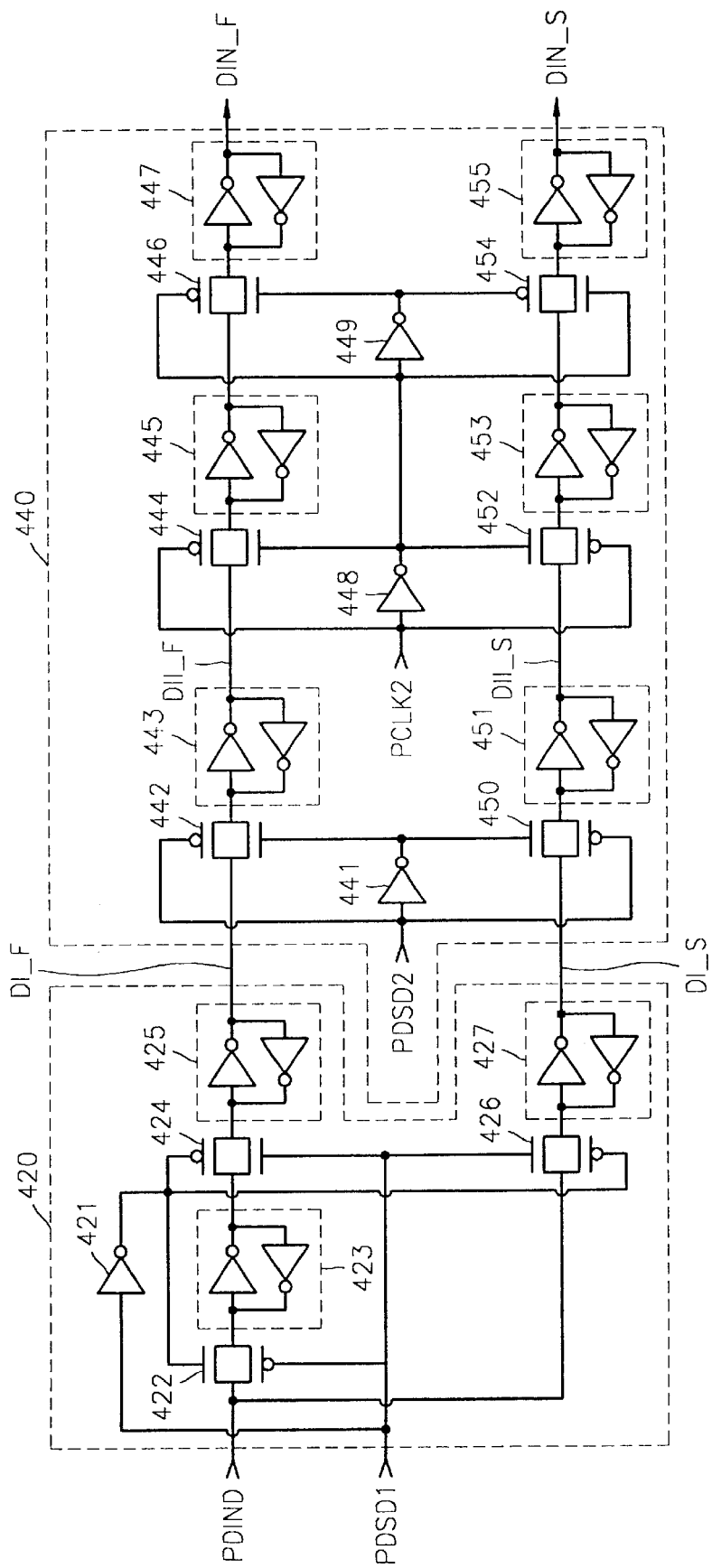
FIG. 5 is a schematic diagram of a data fetch circuit and a synchronous circuit of FIG. 4.

FIG. 5 shows schematics of a data fetch circuit and a synchronization circuit of FIG. 4. Referring to FIG. 5, data fetch circuit 420 may comprise inverter 421, transmission gates 422, 424, and 426, and latch circuits 423, 425, and 427. The second internal input data signal PDIND may be transmitted responsive to the second internal data strobe signal PDSD1 enablement of transmission gates 422, 424, and 426. It may be observed that both the primary data and compliment data may be fetched from the input data signal by the data fetch circuit 420 for generating the first set of complimentary parallel data signals DI_F and DI_S. The first set of parallel data signals DI_F and DI_S may be latched by latch circuits 425 and 427 respectively.

Synchronization circuit 440 may comprise inverters 441, 448 and 449, operable to control respective transmission gates 442,450 and 444,452 and 446,454, for coupling of signals to respective latch circuits 443,451 and 445,453 and 447,455. As used herein, "transmission gates" may be referenced alternatively as "pass gates." The first set of parallel data signals DI_F and DI_S may be transmitted by respective transmission gates 442,450 when enabled by the third internal data strobe signal PDSD2. The latched primary and compliment data signals of latches 425,427 may then be forwarded by the enabled pass-gates 442,450 to latches 443,451. This fetched and latched data of latches 443,451 may then provide the second set of parallel data signals DII_F and DII_S.

Next, the second set of parallel data signals DII_F and DII_S may be forwarded (by pass gates 444,452 when enabled by the second internal clock signal PCLK2) to latch circuits 445 and 453. A second phase of clock signal PCLK2 may enable pass gates 446,454 to forward the signals of latches 445,453 into latches 447,455. Latches 447,455 may then provide the resulting set of parallel data signals DIN_F and DIN_S. The resulting set of parallel data signals DIN_F and DIN_S may be latched by latch circuits 447 and 455.

Figure 6:
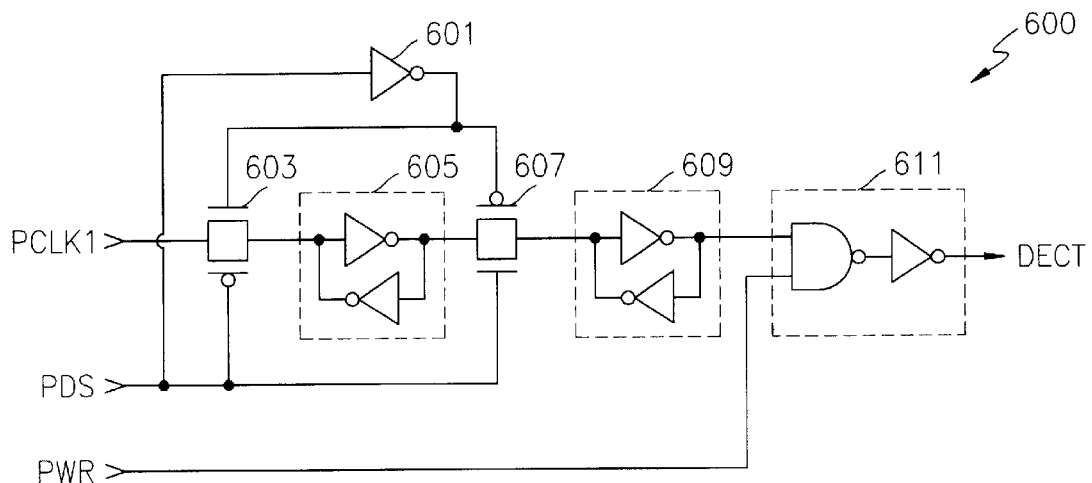
FIG. 6 is a schematic diagram of a detection circuit of FIG. 4.
Figure 7:
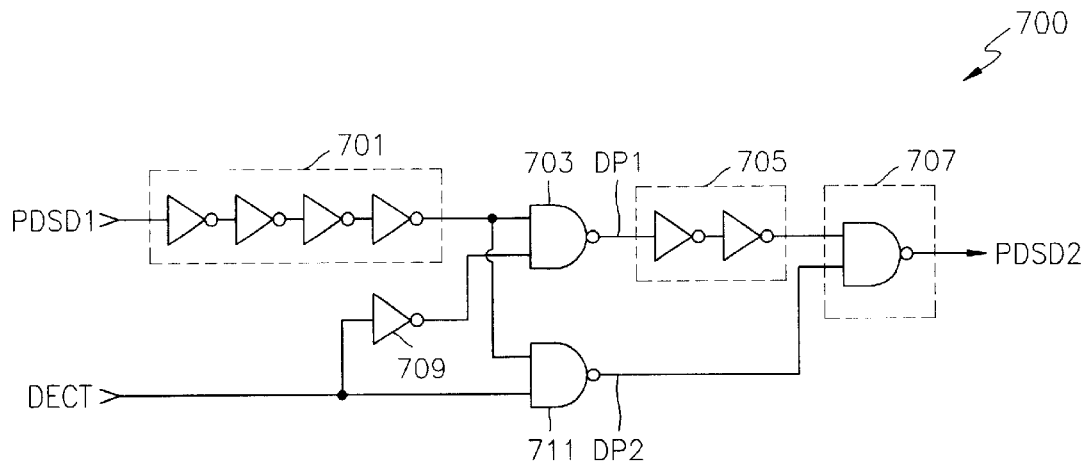
FIG. 7 is a schematic diagram of a second delay circuit of FIG. 4.

FIG. 6 shows a schematic for a detection circuit of FIG. 4, and FIG. 7 shows a schematic for a second delay circuit of FIG. 4. Referring to FIGS. 6 and 7, detection circuit 600 may comprise inverter 601, transmission units 603 and 607, latch units 605 and 609, and AND circuit 611. The second delay circuit 700, referencing FIG. 7, may comprise inverter chains 701 and 705, NAND gates 703 and 711, OR circuit 707, and inverter 709. Returning to FIG. 6, the transmission units 603 and 607 may comprise transmission gates, and latch units 605 and 609 may comprise cross-coupled inverters.

In the case of tDQSS_MIN, the phase of the first internal data strobe signal PDS may lead that of the first internal clock signal PCLK1 by one-fourth of a cycle of the clock signal —i.e., tCK/4. Thus, the detection signal DECT may assume a logic "high" state; and a first delay path DP1 may be selected by the detection signal DECT of the logic "high" state. The second internal data strobe signal PDSD1 may be delayed per the delay duration of the first path DP1. It may be noted that this duration of the first delay path DP1 may be greater than that of the second delay path DP2. As a result, the third internal data strobe signal PDSD2 may be generated with a later presentment in comparison with the strobe signal PDSD2 that might otherwise be presented for the case of tDQSS_MAX.

In the case of tDQSS_MAX, the phase of the first internal data strobe signal PDS may lag that of the first internal clock signal PCLK1 by up to one-fourth of a cycle of the clock signal—i.e., tCK/4. The detection signal DECT may assume a logic "low" state. The second delay path DP2 may be selected by the detection signal DECT of the logic "low" state. Thus, the second internal data strobe signal PDSD1 may be delayed with a duration less than that which would otherwise be provided by the first delay path DP1. As a result, the data strobe signal PDSD2 generated per the second delay path may present an edge more quickly than for the previously described case of tDQSS_MIN.

In exemplary embodiments of the present invention, a phase relationship between the data strobe signal DS and the clock signal CLK may be classified into two separate cases. However, in other embodiments of the present invention, the phase relationship between these signal may be further subdivided; and, likewise, the durations for the delay of the data strobe signal may also be further subdivided.

Figure 8:
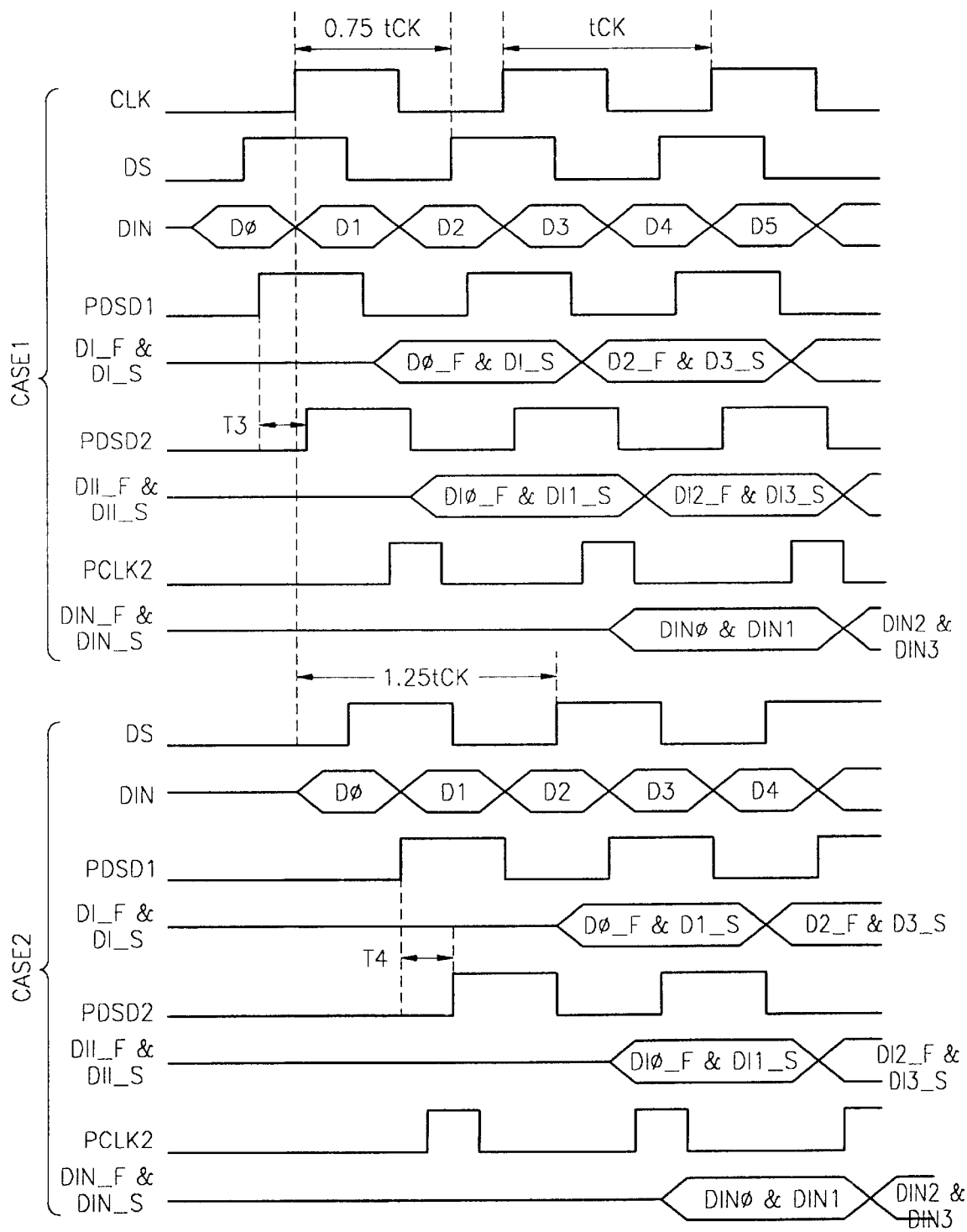
FIG. 8 is a timing diagram useful for describing operation of the data input circuit of FIG. 4 when a cycle of an external clock signal CLK is relatively small.

FIG. 8 is a simplified timing diagram useful for describing operation of the data input circuit of FIG. 4, when a the cycle of a clock signal CLK may decrease to a predetermined threshold period, or when the frequency of the clock signal may exceed a predetermined frequency.

In the case of tDQSS_MIN (CASE1), a first time interval T3 may represent the delay between an edge of the second internal data strobe signal PDSD1 and that of the third internal data strobe signal PDSD2. It may be noted that for this case (CASE1) where the phase of the strobe signal leads that of the clock signal, that the duration of the delay T3 may be greater than that T4 provided for the alternative case (CASE2) to be described below. Thus, the first set of parallel data signals DI_F and DI_S to be fetched by the second internal data strobe signal PDSD1 may be reliably synchronized to the second internal clock signal PCLK2 and valid data generated for the signals DIN_F and DIN_S.

In the case of tDQSS_MAX (CASE2), a second time interval T4 may represent the delay between an edge of the second internal data strobe signal PDSD1 and that of the third internal data strobe signal PDSD2. For this case (CASE2), where the phase of the strobe signal lags that of the clock signal and in contrast to the previously described case (CASE1), the duration for the delay of second delay circuit may be set to the shorter delay path. Accordingly, the delay duration T4 may be less than that of the previously described case. Thus, the first set of parallel data signals DI_F and DI_S to be fetched by the second internal data strobe signal PDSD1 may be kept synchronized effectively with reference to the second internal clock signal PCLK2 even though its frequency may have increased. For such embodiment, valid data may be preserved for synchronous input to the memory device.

Thus, a data input circuit for a synchronous semiconductor memory device in accordance with this embodiment, can effectively adjust the synchronization of an input data signal dependent upon the frequency of a clock signal. For such exemplary embodiments, when the cycle of the clock signal may decrease or when the frequency of the clock signal may increase to a predetermined threshold, a relative phase adjustment may be made to the synchronization circuitry to assist more accurate synchronization of data of a data input signal.

While exemplary embodiments of the present invention have been shown and described herein, it will be understood by those skilled in the art that various changes in form and details may be made therein without departing from the spirit and scope of the invention.

What is claimed is:

1. A circuit for a synchronous semiconductor memory device, comprising:
   a first delay unit to receive a strobe signal and delay the strobe signal to provide a delayed strobe signal;
   a fetch circuit to fetch data from an input data signal to generate a first input data signal;
   the fetch circuit to perform the fetch responsive to the delayed strobe signal;
   a detection unit to detect a relative phase difference between the strobe signal and a clock signal;
   a second delay unit to receive the delayed strobe signal and further delay the delayed strobe signal to generate a second delayed strobe signal;
   the second delay unit operable to adjust a duration of the further delay dependent on the relative phase difference detected by the detection unit; and a data input synchronization unit to fetch data from the first input data signal to generate a second data signal;

the data input synchronization unit to perform the fetch responsive to the further delayed strobe signal.

2. The circuit of claim 1, in which the data input synchronization unit comprises first and second synchronization portions;

the first synchronization portion to perform the generation of the second data signal responsive to the further delayed strobe signal; and the second synchronization portion to fetch data from the second data signal to generate a resultant data signal;

the second synchronization portion to perform the fetch from the second data signal responsive to the clock signal.

3. The circuit of claim 2, in which the detection unit is operable to determine whether the phase of the strobe signal leads or lags that of the clock signal.

4. The circuit of claim 3, in which:

the second delay unit is to set the duration for the delay of the second delay unit to a first duration responsive to the detection unit determining the phase of the strobe signal to lead that of the clock signal; and the second delay unit is to set the duration for the delay of the second delay unit to a second duration responsive to the detection unit determining the phase of the strobe signal to lag that of the clock signal.

5. The circuit of claim 4, in which the detection unit is operable to detect a relative phase difference between the strobe signal and the clock signal of up to one-fourth of a cycle of the clock signal.

6. The circuit of claim 4, in which the second delay unit is to set the magnitude of the first duration to be larger than that of the second duration.

7. The circuit of claim 2, further comprising:

a pulse circuit to generate a pulse responsive to a transition of the clock signal;

the second synchronization portion of the data input synchronization unit to perform the fetch of data from the second data signal responsive to a pulse generated by the pulse circuit.

8. A data input circuit for a synchronous semiconductor memory device, the circuit comprising:

a data delay circuit to delay a data signal;

a first delay circuit to delay a strobe signal and generate a delayed strobe signal;

a detection circuit to detect whether the phase of the strobe signal leads or lags that of the clock signal;

a data fetch circuit to fetch data from the data signal delayed by the data delay circuit and generate a firstly synchronized data signal;

the data fetch circuit to perform the fetch responsive to the delayed strobe signal generated by the first delay circuit;

a second delay circuit to receive the delayed strobe signal generated by the first delay circuit and to further delay the delayed strobe signal with a duration dependent on the detecting of the detection circuit; and a synchronization circuit to synchronize the firstly synchronized data signal with the strobe signal further delayed and generate a secondly synchronized data signal.

9. The circuit of claim 8, in which:

the synchronization circuit is to fetch data from the firstly synchronized data signal to generate the secondly synchronized data signal responsive to the further delayed strobe signal; and the synchronization circuit is additionally operable to further synchronize the secondly synchronized data signal to the clock signal and generate an output synchronized data signal.

10. The circuit of claim 9, further comprising a pulse circuit to generate a pulse responsive to a transition of the clock signal;

the synchronization circuit to perform the further synchronization by fetching data from the secondly synchronized data signal responsive to the pulse generated by the pulse circuit.

11. The circuit of claim 8, the data fetch circuit to also fetch compliment data from the data signal to generate a compliment data signal;

the data fetch circuit to provide the data and the compliment data signals as a first set of parallel data signals;

the synchronization circuit to synchronize the compliment data signal together with the data signal of respective parallel signal sets to be associated with the firstly and secondly synchronized data signals.

12. The circuit of claim 8, further comprising:

a data buffer to buffer the data signal to be delayed by the data delay circuit;

a strobe buffer to buffer the strobe signal to be delayed by the first delay circuit; and a clock buffer to buffer the clock signal to be used by the detection circuit.

13. The circuit of claim 10, in which the detection circuit is operable to detect a phase difference between the strobe signal and the clock signal of up to one-fourth of a cycle of the clock signal.

14. The circuit of claim 13, in which the detection circuit outputs a detection signal of a first logic value when the phase of the strobe signal leads that of the clock signal, and outputs a detection signal of a second logic value when the phase of the strobe signal lags that of the first internal clock signal.

15. The circuit of claim 14, in which the detection circuit comprises:

a first transmission unit to transmit the clock signal responsive to the strobe signal;

a first latch unit to latch the clock signal transmitted by the first transmission unit;

a second transmission unit to transmit the clock signal latched by the first latch unit responsive to an alternative phase of the strobe signal;

a second latch unit to latch the clock signal transmitted by the second transmission unit; and an AND circuit to perform an AND operation of the clock signal latched by the second latch unit with a write signal and generate the detection signal.

16. The circuit of claim 15, in which each of the first and second transmission units comprises transmission gates.

17. The circuit of claim 16, in which each of the first and second latch units comprises cross-coupled inverters.

18. The circuit of claim 8, in which the second delay circuit comprises:

a first delay path to delay the delayed strobe signal by a first duration in response to a first condition of the detection signal; and a second delay path to delay the delayed strobe signal by a second duration in response to a second condition of the detection signal.

19. The circuit of claim 18, in which the duration for the delay of the first delay path is longer than that of the second delay path.

20. The circuit of claim 19, in which:

the first delay path comprises a first number of serially coupled inverters, and the second delay path comprises a second number of serially coupled inverters, the second number less than the first number.

21. The circuit of claim 8, in which the second delay circuit comprises:

a first NAND gate to perform an AND operation of an inverted signal of the detection signal with reference to the delayed strobe signal delayed by an inverter chain;

a second NAND gate to perform an AND operation of the detection signal with the delayed strobe signal delayed by the inverter chain; and an OR circuit to output at least one of the output signal of the first AND operation delayed by a predetermined time, or the output signal of the second AND operation.

22. A data input method for a synchronous semiconductor memory device, the method comprising:

detecting whether the phase of a strobe signal leads or lags that of a clock signal;

delaying the strobe signal by a first duration when the detecting determines the phase of the data strobe signal to lead that of the clock signal, and by a second duration when the detecting determines the phase of the data strobe signal to lag that of the clock signal; and synchronizing a data signal previously fetched by the strobe signal to the clock signal responsive to a transition of the strobe signal delayed by one of the first and the second durations.

23. The method of claim 22, in which the detecting determines a phase difference between the strobe signal and the clock signal of up to one-fourth of a cycle of the clock signal.

24. The method of claim 23, in which the first duration for the delaying of the strobe signal is longer than the second duration.

* * * * *